(12) United States Patent
Lee

(10) Patent No.: US 7,183,599 B2
(45) Date of Patent: Feb. 27, 2007

(54) CMOS IMAGE SENSOR HAVING TEST PATTERN THEREIN AND METHOD FOR MANUFACTURING THE SAME

(75) Inventor: Won-Ho Lee, Ichon-shi (KR)

(73) Assignee: Magnachip Semiconductor, Ltd. (KR)

( * ) Notice: Subject to any disclaimer, the term of this patent is extended or adjusted under 35 U.S.C. 154(b) by 0 days.

(21) Appl. No.: 11/373,811

(22) Filed: Mar. 9, 2006

(65) Prior Publication Data
US 2006/0151817 A1 Jul. 13, 2006

Related U.S. Application Data

(62) Division of application No. 10/747,324, filed on Dec. 23, 2003, now Pat. No. 7,049,167.

(30) Foreign Application Priority Data
Apr. 30, 2003 (KR) .............. 10-2003-0027769

(51) Int. Cl.
*H01L 31/062* (2006.01)
(52) U.S. Cl. ............... 257/291; 257/292; 257/E27.108
(58) Field of Classification Search ............... 257/291, 257/292, E21.632, E27.046, E27.064, E27.108; 438/48, 66, 75, 81, 144
See application file for complete search history.

(56) References Cited

U.S. PATENT DOCUMENTS

| | | | | |
|---|---|---|---|---|
| 5,760,458 A | * | 6/1998 | Bergemont et al. ......... | 257/588 |
| 6,010,925 A | * | 1/2000 | Hsieh ........................ | 438/197 |
| 6,043,544 A | * | 3/2000 | Michael et al. ............. | 257/407 |
| 6,521,925 B1 | * | 2/2003 | Mori et al. ................. | 257/292 |
| 6,610,555 B1 | * | 8/2003 | Bryant et al. ............... | 438/48 |
| 6,617,174 B2 | * | 9/2003 | Rotstein ..................... | 438/7 |
| 6,677,656 B2 | * | 1/2004 | François .................... | 257/462 |
| 6,784,015 B2 | * | 8/2004 | Hatano et al. .............. | 438/75 |
| 2002/0022297 A1 | * | 2/2002 | Tanabe ...................... | 438/60 |
| 2004/0033666 A1 | * | 2/2004 | Williams et al. ............ | 438/297 |
| 2004/0080638 A1 | * | 4/2004 | Lee ........................... | 348/272 |
| 2004/0164293 A1 | * | 8/2004 | Maloney et al. ............. | 257/40 |
| 2004/0217397 A1 | * | 11/2004 | Lee ........................... | 257/292 |
| 2004/0217398 A1 | * | 11/2004 | Lee ........................... | 257/292 |
| 2005/0194639 A1 | * | 9/2005 | Negoro et al. .............. | 257/341 |

* cited by examiner

*Primary Examiner*—Matthew Smith
*Assistant Examiner*—Khiem Nguyen
(74) *Attorney, Agent, or Firm*—Blakely Sokoloff Taylor & Zafman

(57) ABSTRACT

The method for manufacturing a test pattern for use in a CMOS image sensor is employed to measure a sheet resistivity of each ion implantation region, respectively. The method includes steps of: forming an FOX area on a semiconductor substrate so as to define an active area; forming a first blocking pad on the semiconductor substrate being overlapped partially the active area and the FOX area, wherein the first blocking pad has a pair of blocking pads separated by a predetermined distance from each other; carrying out a first ion implantation process by using the first blocking pad as a mask, thereby forming a first ion implantation region; forming a second blocking pad between the pair of blocking pads; carrying out a second ion implantation process by using the first and the second blocking pads as the mask, thereby forming a second ion implantation region; and forming a first and a second test pad which are electrically connected to contacts for measuring a sheet resistivity of the first and second ion implantation regions, respectively.

15 Claims, 5 Drawing Sheets

CMOS IMAGE SENSOR HAVING TEST PATTERN THEREIN AND METHOD FOR MANUFACTURING THE SAME

The present patent application is a Divisional of application Ser. No. 10/747,324, filed Dec. 23, 2003. Now U.S. Pat. No. 7,049,167.

FIELD OF THE INVENTION

The present invention relates to a semiconductor device and a method for manufacturing the same; and, more particularly, to a complementary metal oxide semiconductor (CMOS) image sensor having a test pattern therein for measuring a sheet resistivity of an ion implantation region and a method for manufacturing the same.

DESCRIPTION OF THE PRIOR ART

Typically, a semiconductor device is manufactured by carrying out an ion implantation process, a photolithography process, an etching process, a diffusion process and a metal process, repeatedly so as to form desired circuits on the wafer.

In particular, the ion implantation process and the diffusion process are employed to inject predetermined impurities into a semiconductor substrate, whereby the semiconductor device has an electrical property. Meanwhile, as the semiconductor device is highly integrated and miniaturized, the ion implantation process has been popularly used for injecting the impurities into the semiconductor substrate. That is, the ion implantation process has an advantage that it is possible to control an ion implantation amount and a depth of an ion implantation region by adjusting a supplied energy, thereby providing a high product yield because of its good uniformity and reproducibility.

Meanwhile, a complementary metal oxide semiconductor (CMOS) image sensor is generally manufactured by using a CMOS technology, wherein the CMOS image sensor comprises mainly a unit pixel and a logic circuit. Especially, the unit pixel includes a photodiode for sensing a light and producing photocharges and nMOSFETs (n-type metal oxide semiconductor field effect transistor) for converting an optical signal transmitted from the photodiode into an electrical signal. During a fabrication of the unit pixel of the CMOS image sensor, several ion implantation processes should be carried out for forming an impurity region, e.g., the photodiode, a source/drain region and a lightly doped drain (LDD) and so forth.

Referring to FIG. 1, there is provided a cross sectional view setting forth a unit pixel 100 of an exemplary CMOS image sensor having four transistors therein.

In FIG. 1, a p-type epitaxial layer 112 is formed on a p-type semiconductor substrate 110, which is epitaxially grown up by a predetermined process. In the unit pixel 100, a p-type well is formed in a predetermined location of the p-type epitaxial layer 112 of the unit pixel 100, where a drive transistor (Dx) and a select transistor (Sx) are formed in the p-type well during a post fabrication process. In the other predetermined location of the p-type epitaxial layer 112, there is formed a photodiode, a transfer transistor (Tx) and a reset transistor (Rx). Herein, the photodiode has a PN junction of a deep n-type impurity region 118 and a shallow p-type impurity region 120 by means of a double ion implantation technique. While the driver transistor (Dx) and the select transistor (Sx) have source/drain regions 124 with LDDs 116, the transfer transistor (Tx) and the reset transistor (Rx) have the source/drain regions 124 without LDDs. The LDDs 116 are formed by implanting low concentration n-type dopants (N$^-$) and the source/drain regions 124 except the LDDs 116 are formed by implanting high concentration n-type dopants (N$^+$).

One side of a gate electrode of the transfer transistor (Tx) is connected to the photodiode and the other side is connected to a floating diffusion region (FD). In addition, one side of a gate electrode of the reset transistor (Rx) is connected to the floating diffusion region (FD) and the other is connected to a power supply voltage (VDD). Herein, the floating diffusion region (FD) is also formed by implanting high concentration n-type dopants (N$^+$).

As described above, the photodiode and the transistors are formed by carrying out one or more ion implantation process. Especially, the photodiode, the drive transistor (Dx) and the select transistor (Sx) are formed by a plurality of the ion implantation processes. That is, the photodiode can be obtained by carrying out the double ion implantation so as to form the shallow p-type impurity region 120 and the deep n-type impurity region 118 in the p-type epitaxial layer 112. Like this, the drive transistor (Dx) and the select transistor (Sx) are obtained through the double ion implantation processes so as to form the LDDs 116 and the source/drain regions 124.

In detail, a first ion implantation process for forming the deep n-type impurity region 118 of the photodiode and the LDDs 116 of the drive transistor (Dx) and the select transistor (Sx) is carried out before forming sidewall spacers 126 on gate structures. Meanwhile, a second ion implantation process for forming the shallow p-type impurity region 120 and the source/drain regions 124 of the transistors is carried out after the formation of the sidewall spacers 126.

Meanwhile, in order to detect an abnormal ion implantation process during the fabrication of the CMOS image sensor, it is necessary to employ a test pattern. The test pattern is fabricated in a predetermined location of the active area 111 depart from the unit pixel 100 during the ion implantation process for forming the photodiode and a plurality of the transistors in the unit pixel 100 of the CMOS image sensor.

Referring to FIGS. 2A and 2B are a plane view and a cross sectional view setting forth a conventional test pattern 200 for detecting the abnormality of the ion implantation process. Herein, FIG. 2B is a cross sectional view of the conventional test pattern 200 for use in the CMOS image sensor taken along line A–A' of FIG. 2A.

In FIG. 2A, the conventional test pattern 200 is formed in a predetermined location of the active area 211 which is defined by a field oxide (FOX) area 214. The conventional test pattern 200 has an ion implantation region 236 which is correspondent to the ion implantation region for a photodiode and a plurality of transistors in the active area 111 of the unit pixel 100 of the CMOS image sensor, i.e., a shallow p-type impurity region 120 and a deep n-type impurity region 118 of the photodiode and LDDs 116 and the source/drain regions 124 of the transistors. A first test pad 232 and a second test pad 234 are connected to a plurality of contacts 230 for applying a test signal, wherein the first test pad 232 and the second test pad 234 are partially overlapped the active area 211 and the FOX area 214. In FIG. 2A, the marked region and the hatched region represent a first ion implantation region 236A formed by the first ion implantation process and a second ion implantation region 236B formed by the second ion implantation process, respectively. It is noted that the first ion implantation region 236A is same to the second ion implantation region 236B in the conventional test pattern 200. That is, whole the ion implantation regions are subjected to the first and the second ion implantation processes in the conventional test pattern 200.

Referring to FIG. 2B, the FOX area 214 is formed in predetermined locations of the p-type epitaxial layer 212, which defines the active area 211. There are formed the first ion implantation region 236A corresponding to the deep n-type impurity region 118 of the photodiode and the LDDs 116 of the transistors, and the second ion implantation region 236B corresponding to the shallow p-type impurity region 120 of the photodiode and the source/drain regions 124 of the transistors in the unit pixel 100 depicted in FIG. 1.

An interlayer dielectric (ILD) 231 is formed on the active area 211 and the FOX areas 214 and is patterned into a preset shape to form contact holes. The contact holes are filled with a predetermined conductive material, thereby forming the contacts 230, which are connected to the first test pad 232 and the second test pad 234.

According to the conventional test pattern 200, the test pattern 200 can detect the abnormality of the ion implantation region 236 having the first ion implantation region 236A and the second ion implantation region 236B by measuring a sheet resistivity (Rs) of the ion implantation region 236 when an electrical current is applied to the first test pad 232 and the second test pad 234.

However, the measured data, i.e., the sheet resistivity of the ion implantation region 236, is a complex data due to a double ion implantation processes in case of utilizing the conventional test pattern 200. That is, it is difficult to discern by using the measured data which ion implantation process is incorrect. Therefore, in spite of detecting the abnormality of the ion implantation region 236, it is impossible to distinguish which ion implantation process is wrong in case of utilizing the conventional test pattern 200.

In particular, since the first ion implantation process is a very important one in order to obtain an improved optical property of the CMOS image sensor, it is necessary to measure the sheet resistivity of the first ion implantation region 236A exactly. However, the first ion implantation region 236A and the second ion implantation region 236B are not separated in the conventional test pattern 220 so that the conventional test pattern 200 can not satisfy the above demand.

SUMMARY OF THE INVENTION

It is, therefore, a first object of the present invention to provide a test pattern for use in a complementary metal oxide semiconductor (CMOS) image sensor for measuring a sheet resistivity of each ion implantation region.

It is a second object of the present invention to provide a method for manufacturing a test pattern for use in a CMOS image sensor for measuring a sheet resistivity of each ion implantation region.

It is a third object of the present invention to provide a CMOS image sensor having a test pattern therein for measuring a sheet resistivity of each ion implantation region.

It is a fourth object of the present invention to provide a method for manufacturing a CMOS image sensor having test pattern therein for measuring a sheet resistivity of each ion implantation region.

In accordance with a first aspect of the present invention, there is provided a test pattern for use in a CMOS image sensor for measuring a sheet resistivity of each ion implantation region, the test pattern including: a blocking pad including a first blocking pad and a second blocking pad, wherein the first blocking pad has a pair of blocking pads and the second blocking pad is disposed between the pair of blocking pad; an active area defined by a field oxide (FOX) area including an ion implantation region and a non-ion implantation region, wherein the ion implantation region has a first ion implantation region formed by using the first blocking pad as a mask and a second ion implantation region formed by using the first and the second blocking pads as the mask; and a first test pad and a second test pad disposed on both ends of the active area which are electrically connected to a plurality of contacts, for measuring a sheet resistivity of the first ion implantation region and the second ion implantation region, respectively.

In accordance with a second aspect of the present invention, there is provided a method for manufacturing a test pattern for use in a CMOS image sensor for measuring a sheet resistivity of each ion implantation region, the method including the steps of: a) forming an FOX area on a predetermined location of a semiconductor substrate so as to define an active area; b) forming a first blocking pad on the semiconductor substrate being overlapped partially the active area and the FOX area, wherein the first blocking pad has a pair of blocking pads separated by a predetermined distance from each other; c) carrying out a first ion implantation process by using the first blocking pad as a mask, thereby forming a first ion implantation region; d) forming a second blocking pad between the pair of blocking pads; e) carrying out a second ion implantation process by using the first and the second blocking pads as the mask, thereby forming a second ion implantation region; and f) forming a first and a second test pad which are electrically connected to contacts for measuring a sheet resistivity of the first and second ion implantation regions, respectively.

In accordance with a second aspect of the present invention, there is provided a method for manufacturing a test pattern for use in a CMOS image sensor for measuring a sheet resistivity of each ion implantation region, the method including the steps of: a semiconductor substrate including a unit pixel part and a test patter part, wherein the unit pixel part has a first active area and the test pattern part has a second active area therein; a first blocking pad and a second blocking pad in the second active area, wherein the first blocking pad has a pair of blocking pads being separated by a predetermined distance from each other and the second blocking pad is formed between the pair of blocking pads; a first ion implantation region formed in the unit pixel part and the test pattern part, the first ion implantation region in the test pattern being formed by using the first blocking pad as a mask; a second ion implantation region formed in the unit pixel part and the test pattern part, the second ion implantation region in the test pattern being formed by using the first and the second blocking pads as the mask; and a first test pad and a second test pad which are electrically connected to a plurality of contacts, for measuring a sheet resistivity of the first ion implantation region and the second ion implantation region, respectively.

In accordance with a second aspect of the present invention, there is provided a method for manufacturing a test pattern for use in a CMOS image sensor for measuring a sheet resistivity of each ion implantation region, the method including the steps of: a) forming an FOX area on a predetermined location of a semiconductor substrate, thereby defining a first active area of a unit pixel part and a second active area of a test pattern part; b) forming a gate structure in the unit pixel part and a first blocking pad in the test pattern part, the first blocking pad having a pair of blocking pads therein which are separated by a predetermined distance from each other; c) carrying out a first ion implantation process so as to form a first ion implantation region in the unit pixel part and the test pattern part by using the first blocking pad as a mask; d) forming a second blocking pad in a separated gap having a width of the predetermined distance; e) carrying out a second ion implantation process by using a first and a second blocking pads as the mask so as to form a second ion implantation region in the unit pixel part and the test pattern part; and f) forming a first and a second test pads which are electrically connected to a plurality of contacts, for measuring a sheet resistivity of the first and the second ion implantation regions, respectively.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
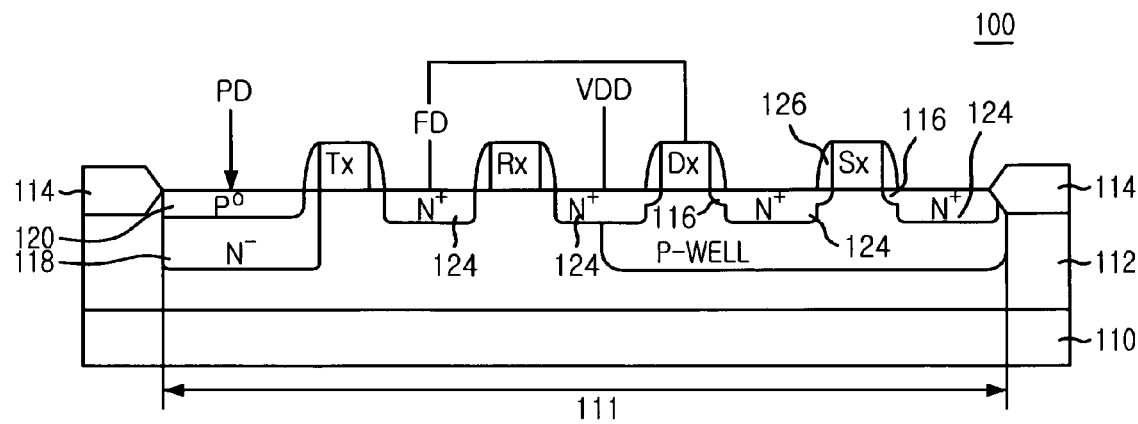
FIG. 1 is a cross sectional view setting forth a unit pixel of an exemplary complementary metal oxide semiconductor (CMOS) image sensor.

There are provided in FIG. 3 and FIGS. 4A to 4E a plane view of a test pattern 300 for measuring a sheet resistivity of each ion implantation region for use in a complementary metal oxide semiconductor (CMOS) image sensor and cross sectional views setting forth a method for the manufacture thereof in accordance with a preferred embodiment of the present invention. It should be noted that like parts appearing in FIG. 3 and FIGS. 4A to 4E are represented by like reference numerals.

Figure 3:
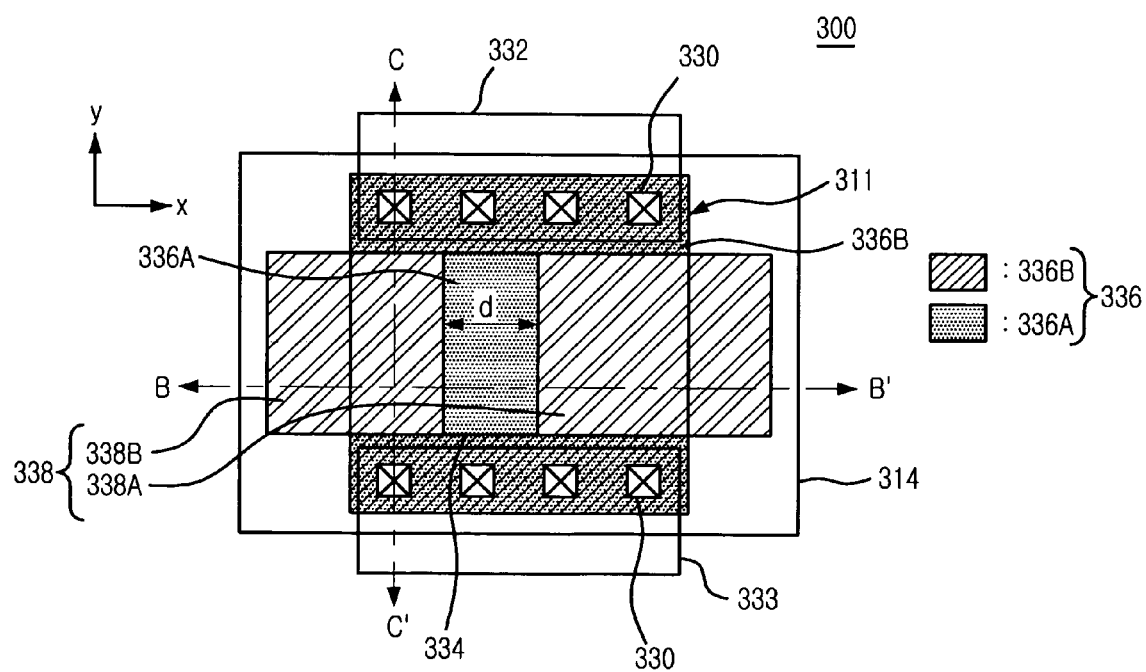
FIG. 3 is a plane view setting forth a test pattern for measuring a sheet resistivity of each ion implantation region for use in the CMOS image sensor in accordance with a preferred embodiment of the present invention.

Referring to FIG. 3, there is shown a plane view of the inventive test pattern 300 for measuring the sheet resistivity of the ion implantation region in accordance with the preferred embodiment of the present invention.

In FIG. 3, an active area 311 includes an ion implantation region 336 implanted by predetermined ions which are depicted in the drawing as a marked region or a hatched region like a shape of an alphabet I, and a non-ion implantation region which is shielded by a first blocking pad 338 so that the predetermined ions are not implanted thereto, which are not denoted in the drawing for the sake of convenience. The first blocking pad 338 has a pair of sub-blocking pads 338A and 338B employing a material such as a polysilicon, wherein the conductive blocking pads 338A and 338B are separated by a predetermined distance (d) and are overlapped partially the active area 311 and the FOX area 314. Within the predetermined distance (d), there is formed a second blocking pad 334, wherein the second blocking pad 334 employs an insulating material such as an oxide or a nitride. That is, the second blocking pad 334 has a width of "d" in an x-directional axis and the same length to that of the first blocking pad 338 in a y-directional axis.

Meanwhile, there are a plurality of contacts 330 formed on both ends of the active area 311. A first test pad 332 and a second test pad 333 are connected to the contacts 330 for applying a test signal so as to measure a sheet resistivity of each ion implantation region 336A and 336B.

Furthermore, the ion implantation region 336 has a first ion implantation region 336A and a second ion implantation region 336B, wherein the first ion implantation region 336A is formed by a first ion implantation process and the second ion implantation region 336B is formed by a second ion implantation process. Herein, the first ion implantation process is carried out by using the first blocking pad 338 as a mask and the second ion implantation process is carried out by using the first blocking pad 338 and the second blocking pad 334 as the mask. The first ion implantation region 336A of the test pattern 300 is corresponding to a deep n-type impurity region of a photodiode and lightly doped drains (LDDs) of transistors in a unit pixel of the CMOS image sensor and the second ion implantation region 336B of the test pattern 300 is corresponding to a shallow p-type impurity region of the photodiode and source/drain regions of the transistors in the unit pixel.

As described above, the inventive test pattern 300 has the first ion implantation region 336A and the second ion implantation region 336B therein by employing the second blocking pad 334 between the conductive blocking pads 338A and 338B. Accordingly, it is possible to measure a sheet resistivity of each ion implantation region 336A and 336B, respectively. In particular, it is possible to exactly measure the sheet resistivity of the first ion implantation region 336A corresponding to the deep n-type impurity region of the photodiode and the LDDs of the transistors in the unit pixel of the CMOS image sensor. Therefore, it is possible to discern which ion implantation process is carried out abnormally by means of the inventive test pattern 300.

Referring to FIGS. 4A to 4D, there are shown cross sectional views setting forth a method for manufacturing the inventive test pattern 300 taken along line B–B' of FIG. 3 and simultaneously a method for manufacturing a unit pixel of the CMOS image sensor in accordance with a preferred embodiment of the present invention.

Figure 4A:
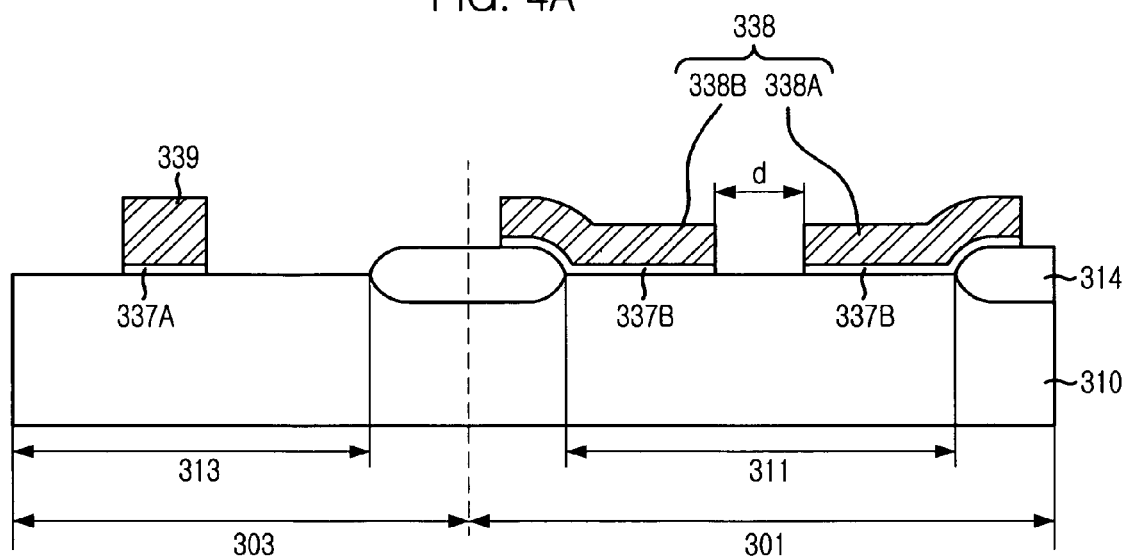
FIGS. 4A to 4D are cross sectional views setting forth a method for manufacturing the unit pixel of the CMOS image sensor and the test pattern taken along line B–B' of FIG. 3 in accordance with the preferred embodiment of the present invention.

In FIG. 4A, an inventive method for manufacturing the CMOS image sensor having the test pattern 300 therein begins with preparing a semiconductor substrate 310 which is divided into a unit pixel part 303 and a test pattern part 301. Thereafter, FOX areas 314 are formed in predetermined locations of the semiconductor substrate 310 so that there are formed a first active area 311 in the test pattern part 301 and a second active area 313 in the unit pixel part 303, respectively. Afterward, a first insulating layer such as an oxide and a conductive layer such as a polysilicon are formed on the semiconductor substrate 310 in sequence. Then, the conductive layer and the first insulating layer are patterned into a predetermined shape, thereby forming a gate electrode 339 and a gate oxide 337A in the unit pixel part 303 and simultaneously forming oxide layers 337B and a first blocking pad 338 provided with a pair of sub-blocking pads 338A and 338B in the test pattern part 301. Herein, the first blocking pad 338 is situated above the active area 301 and the FOX area 314 partially, wherein each conductive blocking pad 338A and 338B is separated by a predetermined distance (d) which is shorter than two times a width of a spacer formed on sidewalls of the gate electrode 339 and the conductive blocking pads 338A and 338B during a post process.

Figure 4B:
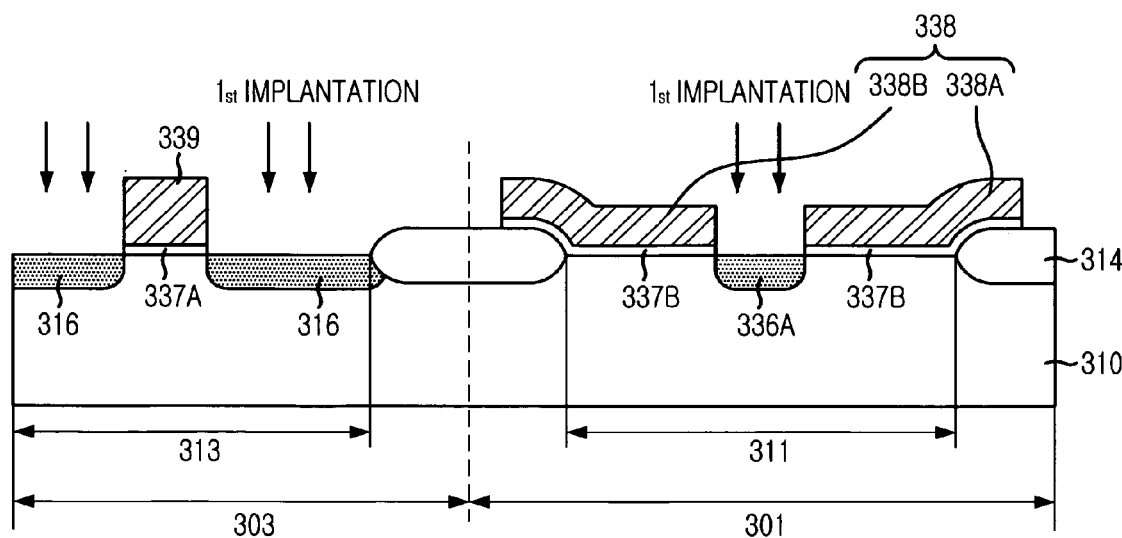

In an ensuing step, referring to FIG. 4B, a first ion implantation process is carried out so as to form a deep n-type impurity region of a photodiode and LDDs 316 of transistors in the unit pixel part 303 and a first ion implantation region 336A in the test pattern part 301 simultaneously. Herein, the photodiode is not described in the drawing for the sake of convenience. Since the first blocking pad 338 is formed over predetermined portions of the semiconductor substrate 310, there is no ion implantation region under the first blocking pad 338 after the first ion implantation process.

Figure 4C:
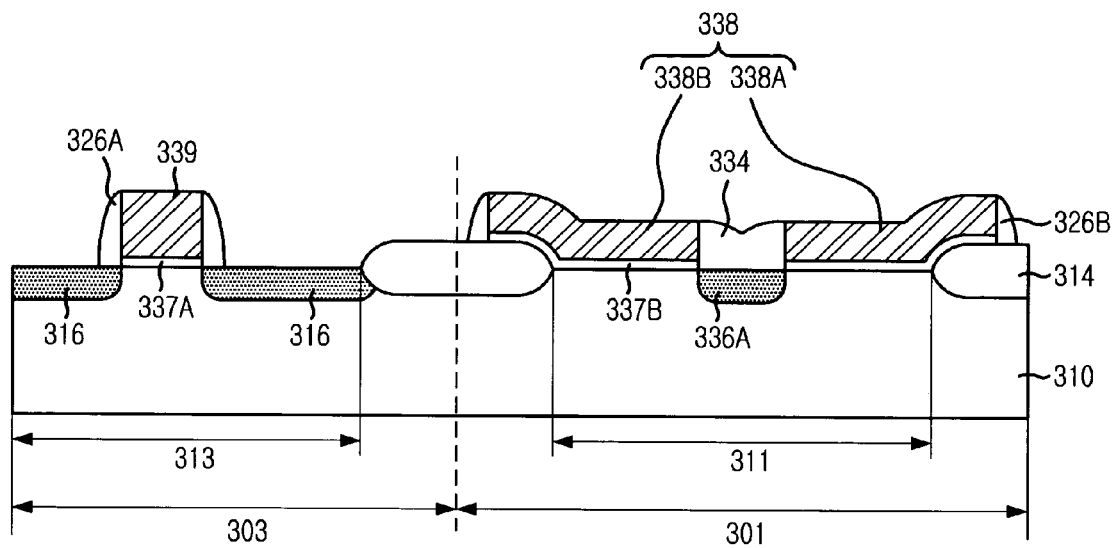

In a subsequent step, referring to FIG. 4C, a second insulating layer is formed over the resultant structure with a thickness in a range of about 1,000 Å to about 1,500 Å and is anisotropically etched so as to form the spacers 326A on the gate electrode 330 in the unit pixel part 303, an second blocking pad 334 in a gap having the predetermined distance (d) and the spacers 326B on the outer sidewalls of the conductive blocking pads 338A and 338B in the test pattern part 301. Herein, the second blocking pad 334 uses a material such as an oxide or a nitride. However, in case of using the oxide as the second blocking pad 334, there may be generated a channeling effect during a post second ion implantation process. Meanwhile, in case of using the nitride as the second blocking pad 334, it is possible to prevent the channeling effect despite the same thickness of the oxide because the nitride has an improved property for preventing a diffusion phenomenon.

Herein, as the spacer is formed thicker and thicker, the predetermined distance (d) can be more broadened, thereby increasing an area of the first ion implantation region 336A so as to reduce the sheet resistivity of the first ion implantation region 336A. At this time, it is noted that the predetermined distance (d) should be also shorter than two times the target width of the spacer. Preferably, in order to reduce the sheet resistivity of the first ion implantation region 336A, the thickness of the spacer can increase to the range of about 2,000 Å to about 2,500 Å.

Since the predetermined distance (d) is shorter than two times the width of the spacer, the second blocking pad 334 is filled into the gap between the conductive blocking pads 338A and 338B without an opening. Provided that the predetermined distance (d) is same to two times the width of the spacer, the second blocking pad 334 has the shape that two adjacent spacers come in contact with each other. Meanwhile, if the predetermined distance (d) is greater than two times the width of the spacer, there is inevitably an open area which will expose a predetermined portion of the semiconductor substrate 310. Therefore, it is important that the predetermined distance (d) should be shorter than two times the width of the spacer in the present invention for preventing ions being implanted into the active area 311 during a post second ion implantation process. For instance, in manufacturing the CMOS image sensor with 0.18 μm scale, it is preferable that the width of the spacer is about 0.15 μm and the predetermined distance (d) is about 0.25 μm.

Figure 4D:
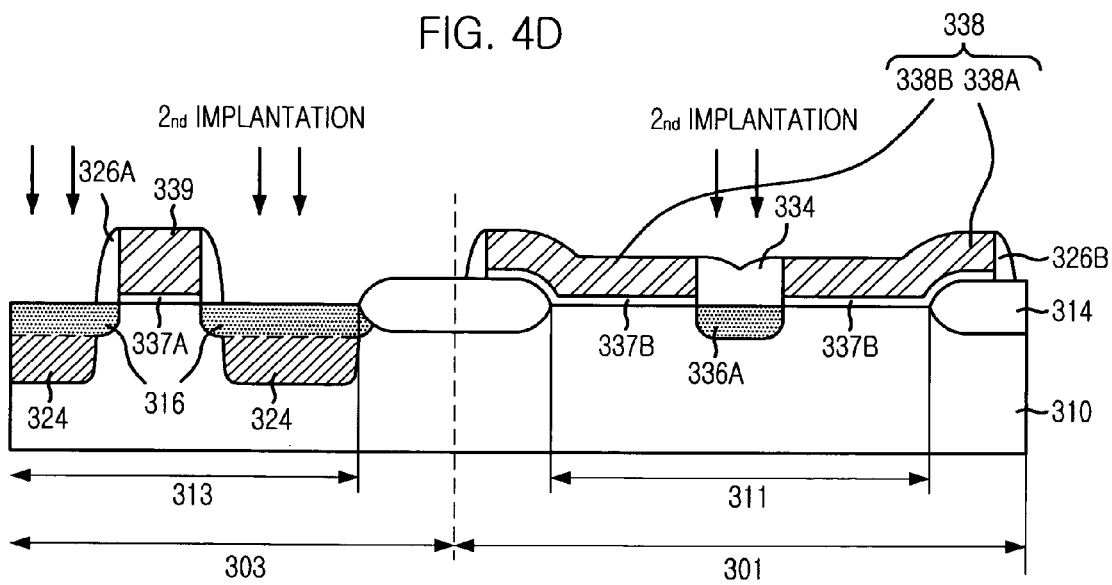
Figure 4E:
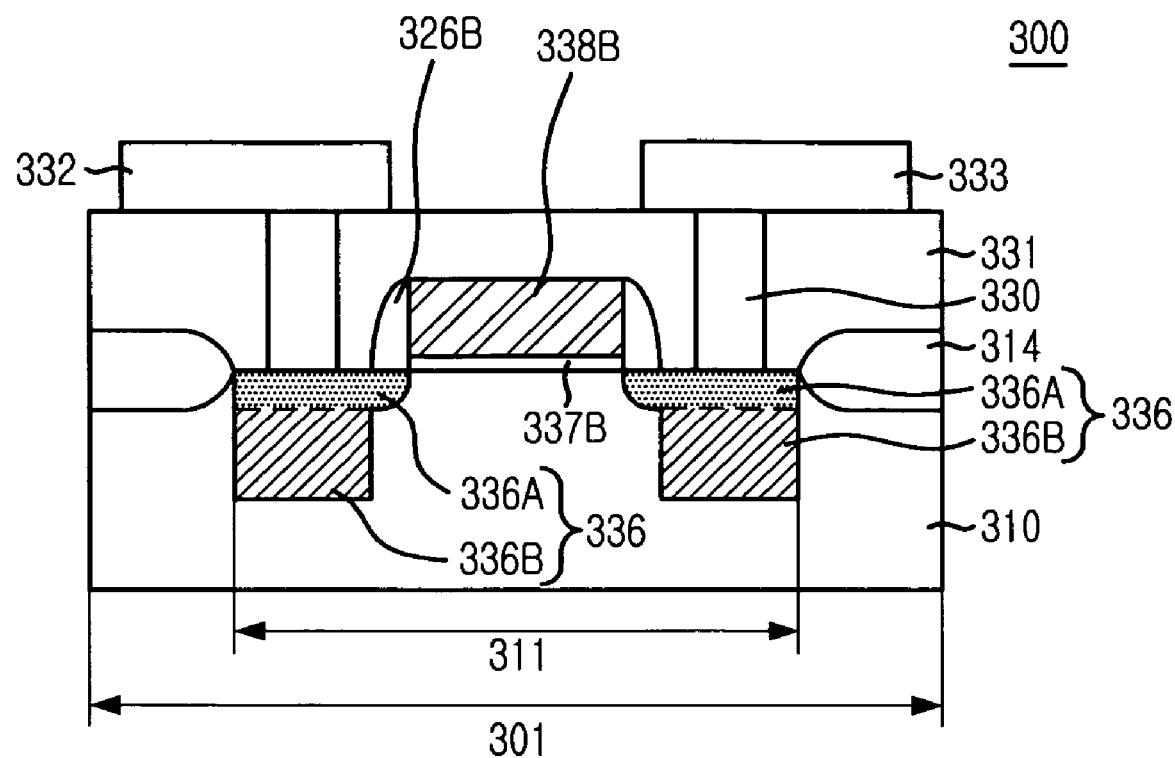
FIG. 4E is a cross sectional view setting forth the method for manufacturing the unit pixel of the CMOS image sensor and the test pattern taken along line C–C' of FIG. 3 in accordance with the preferred embodiment of the present invention.

In a subsequent step, referring to FIG. 4D, a second ion implantation process is carried out so as to form a shallow p-type impurity region of the photodiode and source/drain regions 324 of the transistors in the unit pixel part 303 and a second ion implantation region 336B in the test pattern part 301 which is shown in FIG. 4E. As aforementioned, since the second blocking pad 334 is formed between the conductive blocking pads 338A and 338B, there is only the first ion implantation region 336B under the second blocking pad 334.

Finally, referring to FIG. 4E, which is a cross section view of the inventive test pattern 300 taken along line C–C' of FIG. 3 after carrying out the second ion implantation process, an interlayer dielectric (ILD) 331 is formed over the resultant structure and is patterned into a predetermined configuration, thereby forming contact holes. Thereafter, a predetermined conductive material is filled into the contact holes and is planarized so as to form contacts 330. Subsequently, a metal layer is formed on the contacts 330 and the ILD 331, and is patterned into a preset configuration, thereby forming a first test pad 332 and a second test pad 333 for applying a test signal thereto. Herein, the first test pad 332 and the second test pattern 333 are formed simultaneously during the formation of metal interconnections (not shown) in the unit pixel part 303.

Figure 2A:
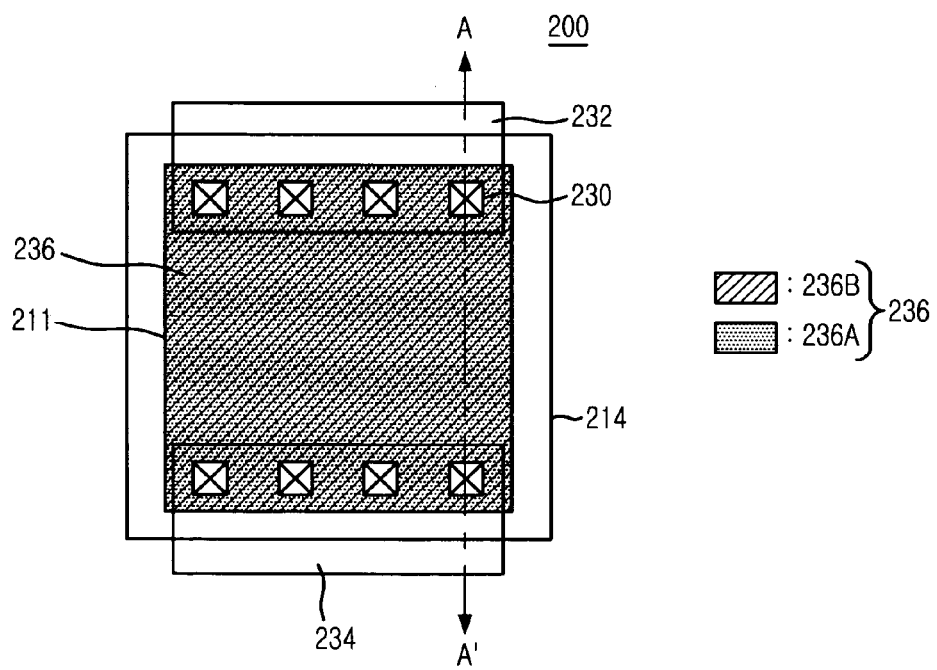
FIG. 2A is a plane view setting forth a conventional test pattern for measuring a sheet resistivity of an ion implantation region for use in the CMOS image sensor.
Figure 2B:
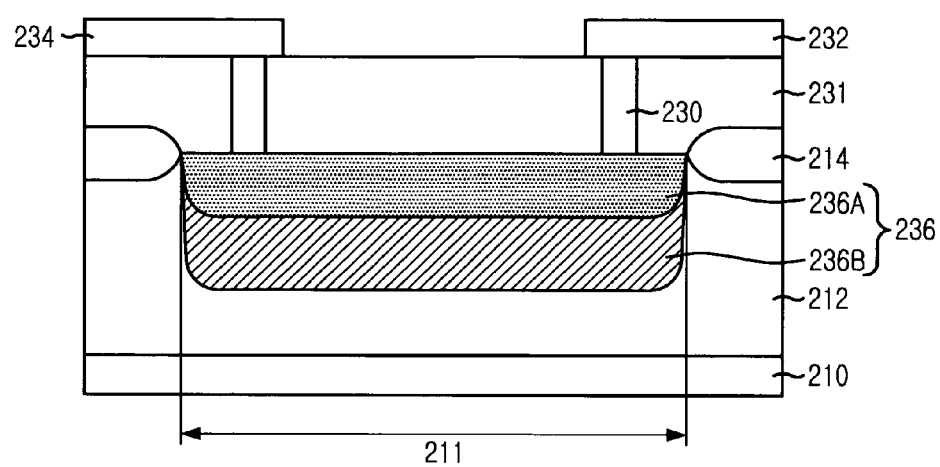
FIG. 2B is a cross sectional view setting forth the conventional test pattern for use in the CMOS image sensor taken along line A–A' of FIG. 2A.

In comparison with the conventional test pattern 200 in FIG. 2, the inventive test pattern 300 has a first ion implantation region 336A and a second ion implantation region 336B therein which are significantly distinguished by forming the second blocking pad 334 between the conductive blocking pads 338A and 338B. By structuring the inventive test pattern 300 like above, it is possible to measure a sheet resistivity of each ion implantation region 336A and 336B respectively. Moreover, it is possible to discern which ion implantation process is carried out abnormally. For example, of the LDD and the source/drain region in the nMOSFET, of the LDD and a HALO region in the nMOSFET, of a low concentration ion implantation region and the HALO region in pMOSFET or of a deep n-type impurity region and a shallow p-type impurity region in the photodiode, it is possible to distinguish which one is incorrect by measuring the sheet resistivity of each ion implantation region 336A and 336B in the test pattern part 301 in accordance with the present invention. In particular, the regions obtained during the first ion implantation process, i.e., the LDDs 316 or the deep n-type impurity region in the unit pixel part 303, is an essential implantation region for determining an electrical property of the CMOS image sensor, which can be exactly measured by using the inventive test pattern 300. Herein, as it is well known, the HALO region is employed to reduce a short channel effect because the short channel effect is an undesirable increase in the threshold voltage of the transistor.

Furthermore, since the inventive test pattern 300 is manufactured simultaneously during the fabrication of the CMOS image sensor through the simple manufacturing process, it is possible to achieve the CMOS image sensor having the test pattern 300 therein with ease.

While the present invention has been described with respect to the particular embodiments, it will be apparent to those skilled in the art that various changes and modifications may be made without departing from the scope of the invention as defined in the following claims.

What is claimed is:

1. A test pattern for testing an active area of a unit pixel for use in a complementary metal oxide semiconductor (CMOS) image sensor, comprising:
   a blocking pad including a first blocking pad and a second blocking pad, wherein the first blocking pad has a pair of sub-blocking pads and the second blocking pad is disposed between the pair of sub-blocking pads, the first blocking pad defining a first ion implantation region and the second blocking pad defining a second implantation region in the active area; and a test pad having a first test pad and a second test pad disposed on both ends of the active area, which are electrically connected to at least one contact, for measuring a sheet resistivity of the ion implantation regions, wherein the second blocking pad fills a gap between the pair of sub-blocking pads without an opening.

2. The test pattern as recited in claim 1, wherein the first blocking pad uses a conductive material and the second blocking pad uses an insulating material.

3. The test pattern as recited in claim 2, wherein the conductive material is a polysilicon.

4. The test pattern as recited in claim 2, wherein the insulating material uses an oxide or a nitride.

5. The test pattern as recited in claim 1, wherein the second blocking pad is formed by anisotropically etching an insulation layer formed on the first blocking pad and an exposed surface of a semiconductor substrate.

6. The test pattern as recited in claim 5 wherein a width of the second blocking pad is substantially the same or less than two times of the width of a spacer formed on a sidewall of the first blocking pad.

7. The test pattern as recited in claim 1, wherein the first ion implantation region is formed by means of a first ion implantation process using the first blocking pad as a mask and the second ion implantation region is formed by means of a second ion implantation process using the first and the second blocking pads as the mask.

8. A CMOS image sensor, comprising:

a unit pixel for sensing a light and converting an optical signal from the light into an electrical signal; and a test pattern for testing an active area of the unit pixel, wherein the test pattern includes:

a blocking pad including a first blocking pad and a second blocking pad, wherein the first blocking pad has a pair of sub-blocking pads and the second blocking pad is disposed between the pair of sub-blocking pads, the first blocking pad defining a first ion implantation region and the second blocking pad defining a second implantation region in the active area, wherein the second blocking pad fills a gap between the pair of sub-blocking pads without an opening; and a test pad having a first test pad and a second test pad disposed on both ends of the active area, which are electrically connected to at least one contact, for measuring a sheet resistivity of the ion implantation regions.

9. The CMOS image sensor as recited in claim 8, wherein the first blocking pad uses a conductive material and the second blocking pad uses an insulating material.

10. The CMOS image sensor as recited in claim 9, wherein the conductive material is a polysilicon.

11. The CMOS image sensor as recited in claim 9, wherein the insulating material uses an oxide or a nitride.

12. The CMOS image sensor as recited in claim 8, wherein the width of the second blocking pad is substantially the same or less than two times of the width of a spacer formed on a sidewall of the first blocking pad.

13. The CMOS image sensor as recited in claim 12, wherein the first ion implantation region is formed by using the first blocking pad as a mask and the second ion implantation region is formed by using the first and the second blocking pads as the mask.

14. The CMOS image sensor as recited in claim 13, wherein the first ion implantation region in the test pattern part is correspondent to a deep n-type impurity region of a photodiode and a lightly doped drain (LDD) of a transistor in the unit pixel part.

15. The CMOS image sensor as recited in claim 13, wherein the second ion implantation region in the test pattern part is correspondent to a shallow p-type impurity region and a source/drain region of the transistor in the unit pixel part.

* * * * *